(12) United States Patent
Giewont et al.

(10) Patent No.: US 6,531,375 B1
(45) Date of Patent: Mar. 11, 2003

(54) METHOD OF FORMING A BODY CONTACT USING BOX MODIFICATION

(75) Inventors: Kenneth J. Giewont, Hopewell Junction, NY (US); Eric Adler, Jericho, VT (US); Neena Garg, Fishkill, NY (US); Michael J. Hargrove, Clinton Corners, NY (US); Charles W. Koburger, III, Essex Junction, VT (US); Junedong Lee, Hopewell Junction, NY (US); Dominic J. Schepis, Wappingers Falls, NY (US); Isabel Ying Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/955,375

(22) Filed: Sep. 18, 2001

(51) Int. Cl.$^7$ .............................................. H01L 21/76
(52) U.S. Cl. .................. 438/407; 438/423; 438/480
(58) Field of Search ................. 438/407, 423, 438/480

(56) References Cited

U.S. PATENT DOCUMENTS

| 4,810,664 A | 3/1989 | Kamins et al. |
| 5,143,858 A | 9/1992 | Tomozane et al. |
| 5,405,795 A | 4/1995 | Beyer et al. |
| 5,468,657 A | 11/1995 | Hsu |
| 5,548,149 A | 8/1996 | Joyner |
| 5,795,800 A | 8/1998 | Chan et al. |
| 5,891,265 A | 4/1999 | Nakai et al. |
| 5,930,643 A | 7/1999 | Sadana et al. |
| 6,043,166 A | 3/2000 | Roitman et al. |
| 6,090,689 A | 7/2000 | Sadana et al. |
| 6,180,487 B1 * | 1/2001 | Lin ............................ 438/407 |

* cited by examiner

Primary Examiner—Carl Whitehead, Jr.
Assistant Examiner—David S Blum
(74) Attorney, Agent, or Firm—McGinn & Gibb, PLLC; H. Daniel Schnurmann

(57) ABSTRACT

A novel method for forming substrate contact regions on a SOI substrate without requiring additional space, and in order to provide lower diffusion capacitance. The method utilizes known semiconductor processing techniques. This method for selectively modifying the BOX region of a SOI substrate involves first providing a silicon substrate. Then, ion implanting the base using SIMOX techniques (e.g. $O_2$ implant) is accomplished. Next, the substrate is photopatterned to protect the modified BOX region. Then, further ion implanting using a "touch-up" $O_2$ implant is accomplished, thereby resulting in a good quality BOX as typically practiced. The final step is annealing the substrate. The area of the substrate, which had a mask present, would not receive the "touch-up" $O_2$ implant (second ion implant), which in turn would result in a leaky BOX.

13 Claims, 4 Drawing Sheets

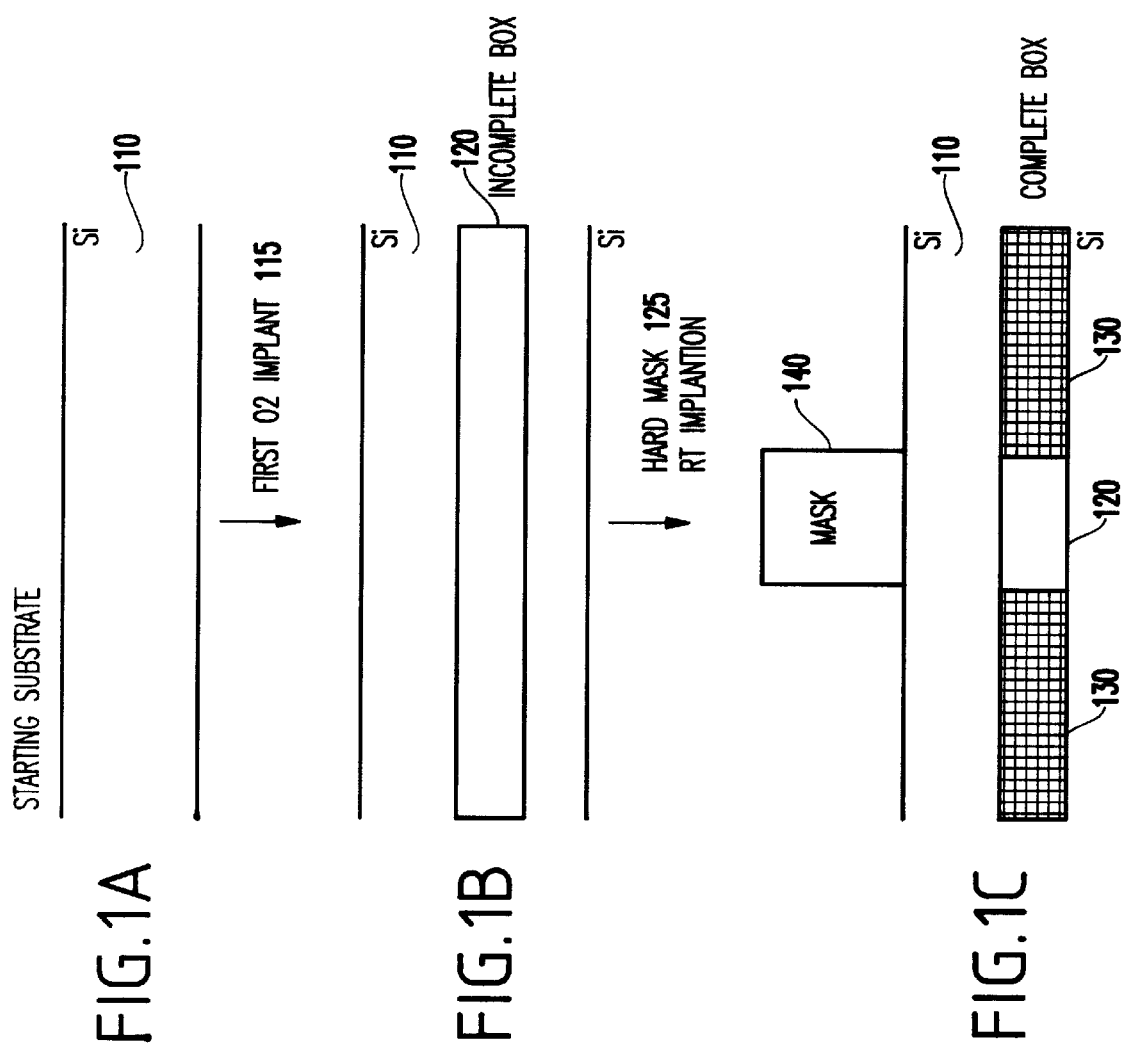
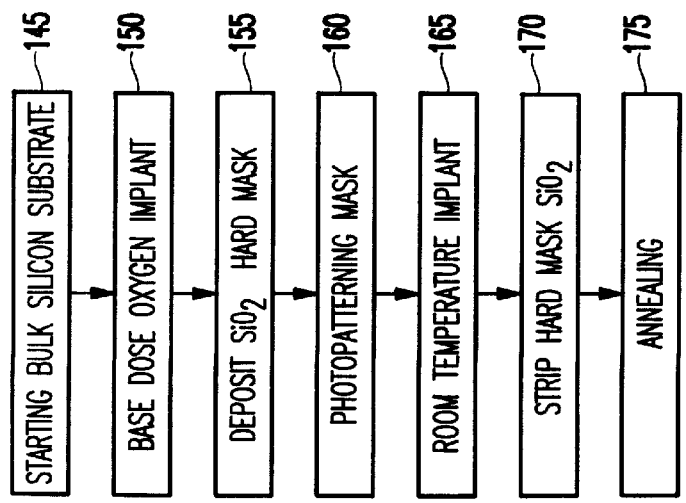

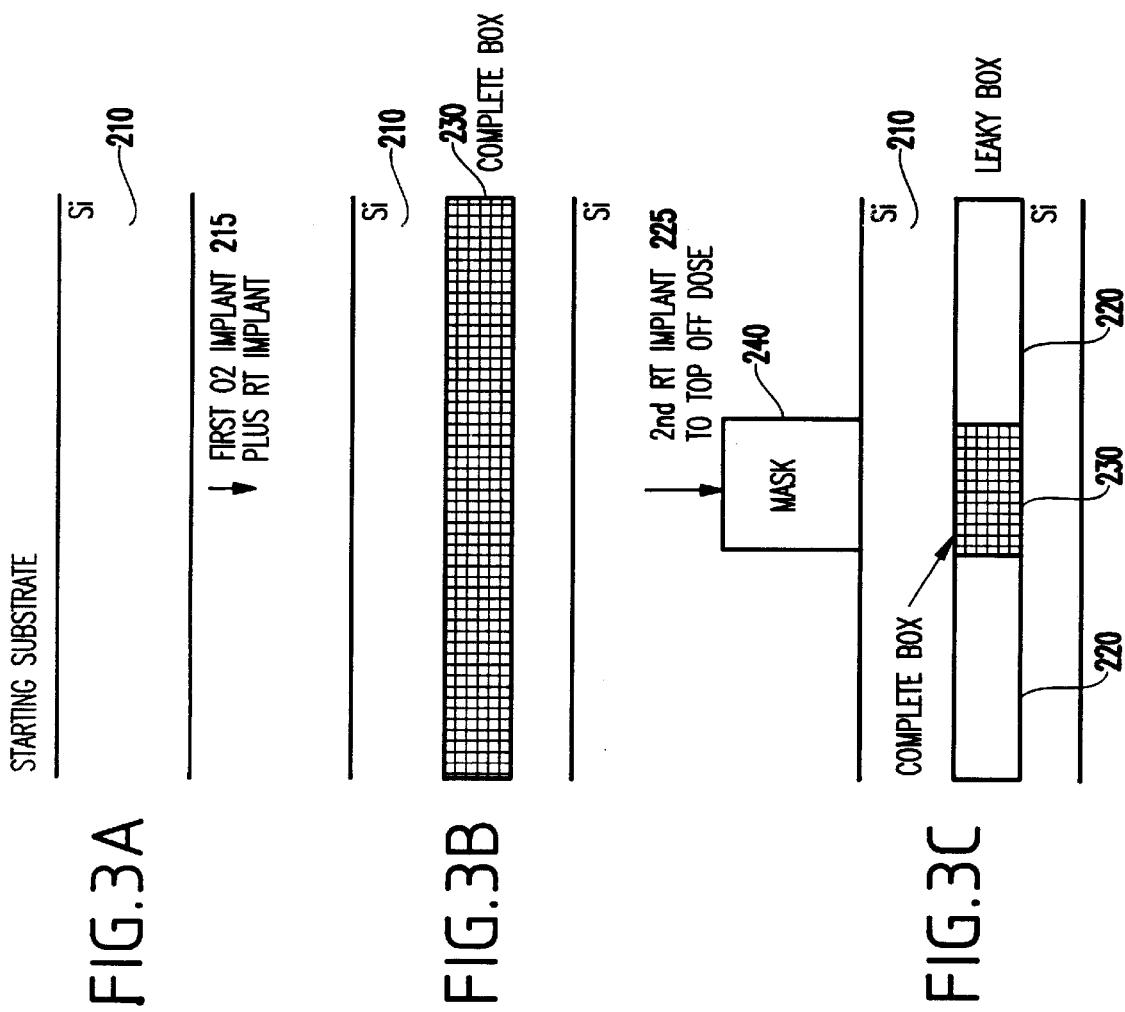
FIG.3A
FIG.3B
FIG.3C
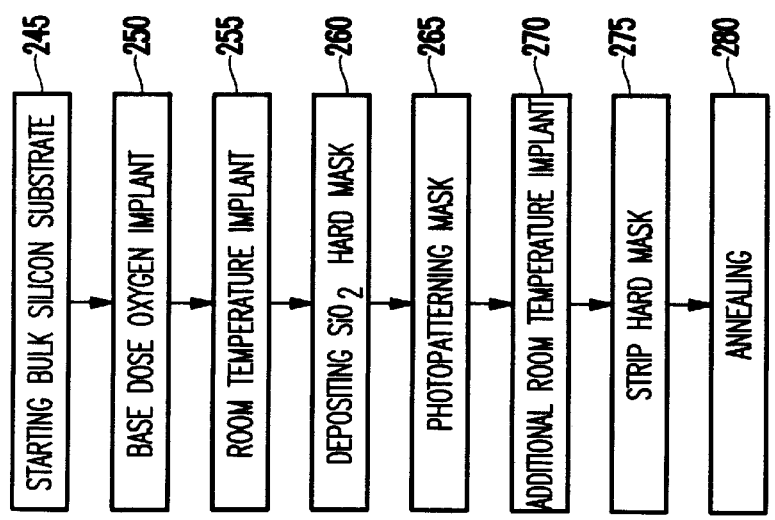
FIG.4

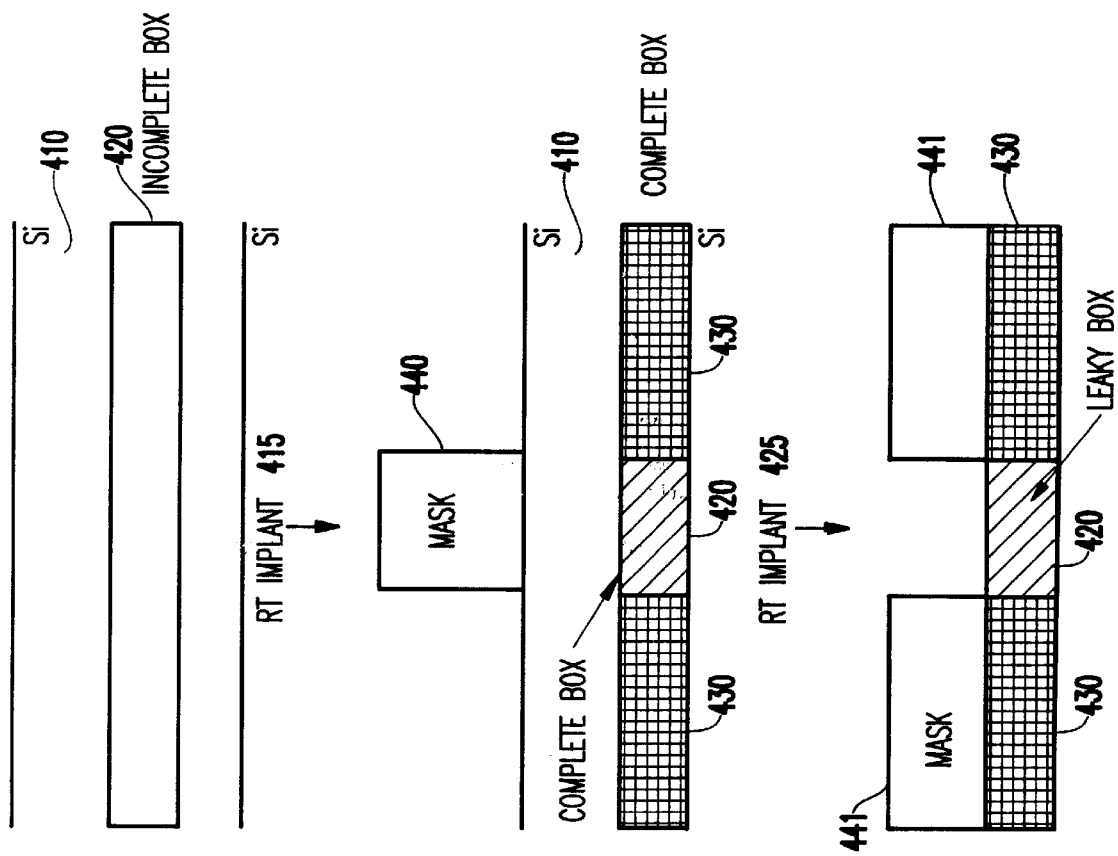
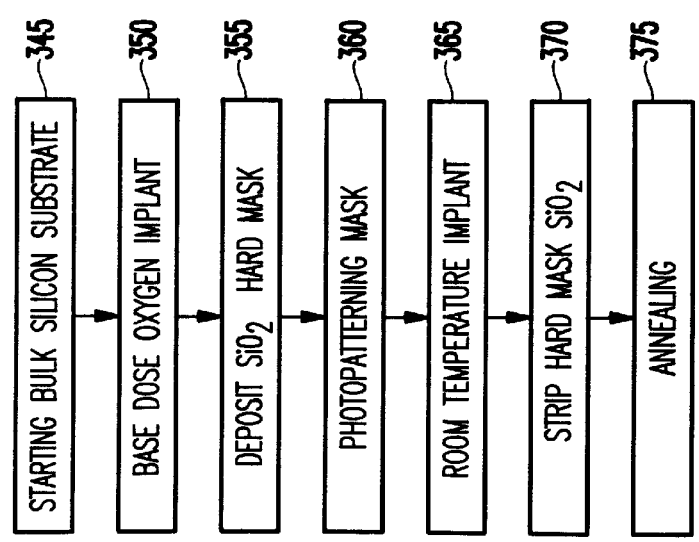

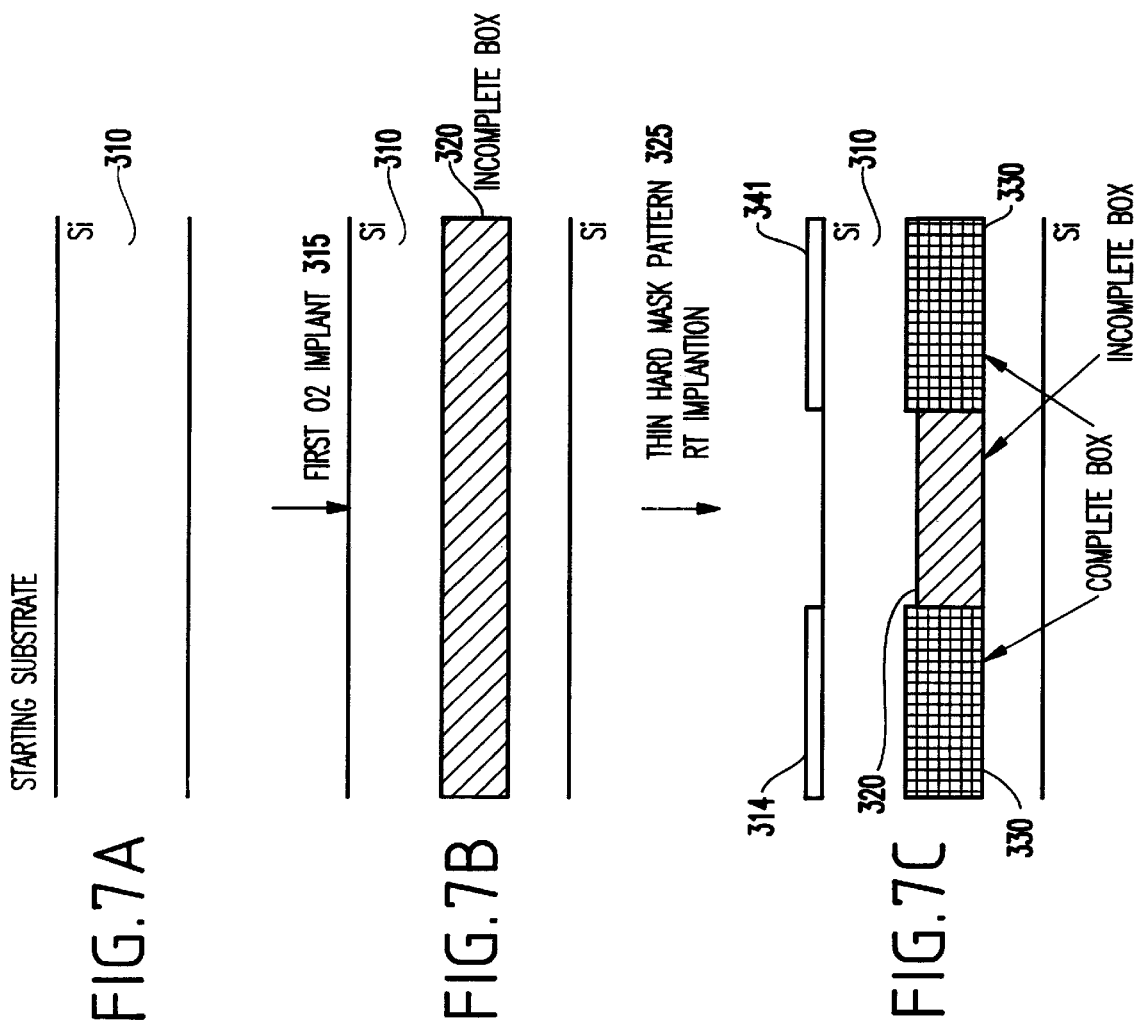
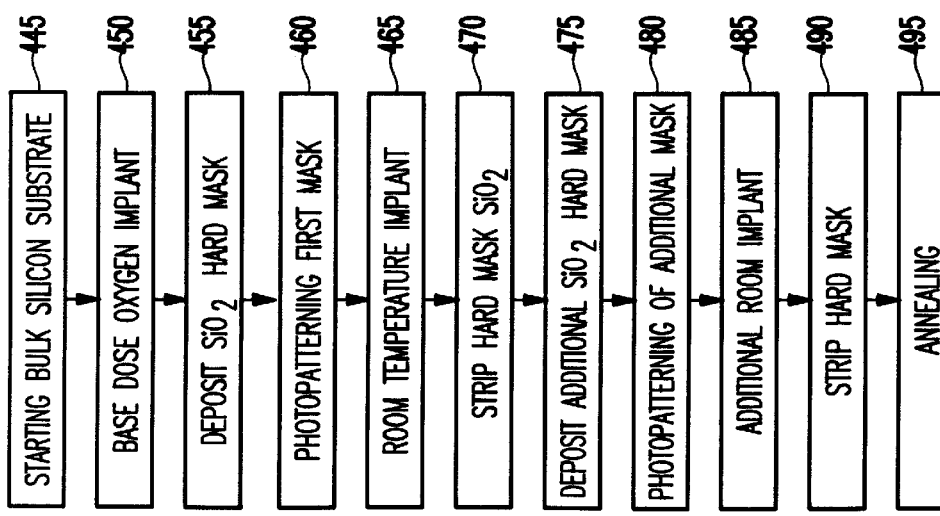

METHOD OF FORMING A BODY CONTACT USING BOX MODIFICATION

BACKGROUND OF THE INVENTION

1. Field of the Invention

The present invention generally relates to integrated circuit devices, and more particularly to an improved method for forming body contacts through the buried oxide region of a SOI semiconductor substrate.

2. Description of the Related Art

In buried layer devices known as silicon-on-insulator (SOI) devices, a buried insulation layer is formed beneath a thin surface silicon film. These devices have a number of potential advantages over conventional silicon devices (e.g., higher speed performance, higher temperature performance and increased radiation hardness).

SOI technology leads to an appreciable simplification of manufacturing processes, an increase in integration density, improved behavior under high voltages, and low sensitivity to radiation, since the volume of monocrystalline silicon is low. Inherent in SOI technology are the various techniques of ion implantation.

In one known technique of ion implantation, known by the acronym SIMOX, a very thin (0.1 micron–0.3 micron) layer of monocrystalline silicon is separated from the bulk of the silicon wafer by implanting a high dose of oxygen ions into the wafer to form a buried dielectric layer of silicon dioxide (having a typical thickness ranging from about 0.05 micron to 0.5 micron). This technique of "separation by implanted oxygen" (SIMOX), provides a heterostructure in which a buried silicon dioxide layer serves as a highly effective insulator for surface layer electronic devices. Thus, this technology consists of implanting oxygen O sup.+ions or nitrogen N sup.+ions in heavy doses in solid monocrystalline silicon, so as to form, after high temperature annealing of the substrate, a buried insulating layer of silicon dioxide or silicon nitride.

As mentioned, one method for forming silicon-on-insulator (SOI) wafers is by "separation by implanted oxygen" (SIMOX). Although the SIMOX method of implanting oxygen ions into silicon has been described in great detail, the electrical properties of the BOX (buried oxide) is generally such that it does not allow leakage of charge from the substrate to the SOI layer.

As SOI CMOS devices get smaller, the devices can suffer from a charge buildup in the body of the devices. This charge can cause a number of less than desirable effects, sometimes referred to as floating body effects. To ensure that specific devices do not suffer from these effects, a body contact is sometimes added as a method to drain off any charge in the body. The drawbacks of body contacts however, is increased size of the devices due to extra contacts. One alternative to front-side contacts is a bottom contact to the body. However, this requires making a contact through the BOX, directly under the body.

Current SOI substrates are used to form SOI devices exclusively, or the BOX depth is regionally altered so that both SOI and bulk devices can be formed on a substrate as taught in U.S. Pat. No. 5,548,149 which is incorporated herein by reference. Additionally, SOI current body contact methods require significant Si area and complex processing (e.g. photopatterning). This is due to the fact that an additional contact must be provided on the front surface of each body contacted device. Conventional processes provide using oxygen implants to form buried oxide layers. However, no process describes such a use in an SOI structure, or to do so in a simple process and for a smaller area. Moreover, the conventional processes are devoid of using such a process for electrical contacts through the BOX directly.

Thus, there is a need for an improved method of forming additional SO substrate contacts, which would reduce area and process complexity, and more specifically a SOI substrate wafer with an insulator having specific electrical properties for body contact applications, and for creating a leaky BOX in a controlled manner.

SUMMARY OF THE INVENTION

In view of the foregoing and other problems, disadvantages, and drawbacks of the conventional SOI formulation and construction, the present invention has been devised, and it is an object of the present invention to provide a method for forming an improved silicon-on-insulator substrate wafer, and more specifically to create a silicon-on-insulator wafer with the insulator having specific electrical properties for body contact applications. It is another object of the present invention to use a leaky BOX in specific areas where the body contacts are desired. Still another object of the present invention is to induce a controlled amount of leakage to the BOX and also to produce this leakage in only specific areas of the substrate wafer. Yet another object of the present invention is to form a leaky BOX selectively on different parts of the substrate wafer.

In order to attain the objects suggested above, there is provided, according to one aspect of the invention a method of selectively modifying the buried oxide (BOX) region of a SOI substrate in order to form a leaky BOX, so as to form non-insulative areas of the BOX, thereby forming a resistive (yet conductive) substrate contact, and providing a method of forming the leaky BOX.

The present invention teaches a novel method for forming substrate contact regions on a SOI substrate without requiring additional space, and in order to provide lower diffusion capacitance. The method utilizes known semiconductor processing techniques. This method for selectively modifying the BOX region of a SOI substrate involves first providing a silicon substrate. Then, ion implanting the base $O_2$ dose using SIMOX techniques (e.g. $O_2$ implant) is accomplished. Next, $SiO_2$ is deposited, followed by photopatterning to create a hard mask on the substrate to protect the modified BOX region. Then, a further ion implanting using a "touch-up" $O_2$ implant is accomplished, thereby resulting in a "good" quality BOX as typically practiced. The final step is to strip the hard mask followed by annealing the substrate. The area of the substrate, which had a hard mask present, would not receive the "touch-up" $O_2$ implant (second ion implant), which in turn would result in a "leaky" BOX.

In other words, the base dose oxygen implant itself creates a region of increased conductivity through the BOX structure. This region has an increased conductivity compared with regions of the substrate, which receive the base dose and "touch-up" oxygen implant. The "touch-up" implant, otherwise referred to as a room temperature implant, creates a non-conducting region in the BOX substrate structure, wherein this non-conducting region has a lower conductivity than the masked region. A mask is employed to block the second implant from specific areas causing a leaky BOX only in the areas defined by the mask.

Alternatively, the second $O_2$ implant used in the BOX formation can be modified by implanting it at a different energy or dose level, such that the usual stoichiometric oxide cannot occur. Each of these techniques leads to a BOX layer that is deficient in the proper concentration of silicon and oxygen, thereby forming an electrically leaky BOX. This requires a slight modification to the process sequence previously described above, wherein the steps now comprise: First, providing a silicon substrate. Second, ion implanting the base $O_2$ dose using SIMOX techniques (e.g. $O_2$ implant) is accomplished. Third, further ion implanting using a "touch-up" $O_2$ implant is accomplished, thereby resulting in a good quality BOX as typically practiced. Fourth, a $SiO_2$ layer is deposited followed by photopatterning to protect the good BOX region. Fifth, further ion implanting using a modified "touch-up" $O_2$ implant by using a different energy dosage or species to result in a "leaky" BOX in the open mask areas is accomplished. And finally, sixth, the hard mask is stripped off and the substrate is annealed.

Still, alternatively, the second $O_2$ implant may be partially blocked by a hard mask such that the implant depth varies in order to make a "good" BOX in one region and a "leaky" BOX in another region. This sequence involves first providing a silicon substrate. The next step involves ion implanting the base $O_2$ dose using SIMOX techniques (e.g. $O_2$ implant). Then, an oxide or a nitride mask layer is deposited at a thickness suitable to provide a partial block of the $O_2$ implant such that the peak concentration depth is changed. After which, the substrate is photopatterned. The next step is to etch the hardmask using a conventional reactive ion etching (RIE) process. Following this step is further ion implanting of the base using a "touch-up" $O_2$ implant, and finally the hard mask is stripped off and the substrate is annealed. The open mask regions can be either the "good" or "leaky" BOX region. Moreover, the "touch-up" $O_2$ implant energy is adjusted in order to achieve the desired result.

In another alternative method, the photopattern is the gate mask, wherein the processing would be as follows: As with the previous methods, a silicon substrate is provided. The next step is ion implantation of the base $O_2$ dose using SIMOX techniques (e.g. $O_2$ implant). Next, photopatterning of the substrate occurs in order to form the gate regions. Then, further ion implanting using a "touch-up" $O_2$ implant is accomplished, in order to result in a "good" BOX outside of the gate region, or in the source drain regions. In this step, the region under the gate photopattern would not receive the "touch-up" $O_2$ implant and thus would result in a "leaky" BOX region. The final step is annealing the substrate.

This alternative method allows for the modification of the BOX area in the source and drain regions to provide a full thickness BOX under the junctions in order to keep capacitance at a minimum. The second oxygen implant would not occur under the gate (channel region). Thus, this region would be deficient of oxygen, and therefore would remain electrically leaky. This leakage under the channel region would be resistive but would make an excellent body contact to the substrate. A single guard ring contact to the substrate through the BOX layer, which is commonly used on most SOI products, would serve to ground any charge built up during switching of this SOI device without any area penalty.

BRIEF DESCRIPTION OF THE DRAWINGS

The foregoing and other objects, aspects and advantages will be better understood from the following detailed description of the preferred embodiments of the invention with reference to the drawings, in which:

FIG. 1A is a schematic cross-sectional diagram of a first embodiment of a method of making a substrate contact according to the present invention;

FIG. 1B is a schematic cross-sectional diagram of a first embodiment of a method of making a substrate contact according to the present invention;

FIG. 1C is a schematic cross-sectional diagram of a first embodiment of a method of making a substrate contact according to the present invention;

FIG. 2 is a flow diagram illustrating the first embodiment of the method of FIG. 1;

FIG. 3A is a schematic cross-sectional diagram of a second embodiment of a method of making a substrate contact according to the present invention.

FIG. 3B is a schematic cross-sectional diagram of a first embodiment of a method of making a substrate contact according to the present invention;

FIG. 3C is a schematic cross-sectional diagram of a first embodiment of a method of making a substrate contact according to the present invention;

FIG. 4 is a flow diagram illustrating the second embodiment of the method of FIG. 3;

FIG. 5A is a schematic cross-sectional diagram of a third embodiment of a method of making a substrate contact according to the present invention;

FIG. 5B is a schematic cross-sectional diagram of a first embodiment of a method of making a substrate contact according to the present invention;

FIG. 5C is a schematic cross-sectional diagram of a first embodiment of a method of making a substrate contact according to the present invention;

FIG. 6 is a flow diagram illustrating the third embodiment of the method of FIG. 5;

FIG. 7A is a schematic cross-sectional diagram of a fourth embodiment of a method of making a substrate contact according to the present invention;

FIG. 7B is a schematic cross-sectional diagram of a first embodiment of a method of making a substrate contact according to the present invention;

FIG. 7C is a schematic cross-sectional diagram of a first embodiment of a method of making a substrate contact according to the present invention; and FIG. 8 is a flow diagram illustrating the fourth embodiment of the method of FIG. 7.

DETAILED DESCRIPTION OF PREFERRED EMBODIMENTS OF THE INVENTION

As mentioned above, there is a need for an improved method for making a substrate contact, and more specifically for a method of forming a silicon-on-insulator (SOI) substrate wafer with an insulator having specific electrical properties for body contact applications. The present invention provides for methods of producing a buried oxide layer (hence called a BOX), with a variable leakage when measured from the top SOI layer to the substrate below the BOX.

One application for implementing the present invention are the SOI devices in a SRAM sense circuit. Since these circuits are very sensitive to noise so that they can sense the state of a SRAM cell, these sense amp circuits may often be built with body contacts when implemented on a SOI. If the sense amp circuits use the implant modification embodiments of the invention, then the area underneath the gates contain a leaky BOX and thus are in electrical contact with the substrate below. Since the substrate is grounded during normal operation, any charge that builds up in the device during normal reading and writing of a cell, would immediately be grounded and no residual charge is left in the body. These undesirable charges are known as floating body effects and are undesirable in many applications of a SOI.

A second application is the use of forming a leaky BOX under a source or drain of a device in the junction area. If the BOX is made to be leaky on two adjacent devices in, for example, the source area, then the two devices are essentially shorted source to source for a specific application where the wiring area above the substrate is limited.

The inventive steps of implanting a first SIMOX implant, followed by a modified second oxygen implant can form a leaky BOX layer, which electrically makes a contact between the SOI layer and the silicon substrate beneath it. This leaky BOX, in conjunction with conventional photopattering, can be used to make selective regions of the SOI shorted to the substrate. If these areas are selectively formed under the gate regions, an efficient body contact can be formed.

Conventional solutions to the problems addressed above mainly consist of extending the SOI region in one direction laterally, and then forming an electrical contact from the front surface of the chip to the body of the device by conventional methods. These conventional methods use more silicon area on the surface of the chip and also increase process complexity when compared to the invention.

The detailed processes and the embodiments that follow are designed as examples on how to create a leaky BOX in a controlled fashion. Several methods to form the leaky BOX selectively on different parts of the wafer are also described, however, it is understood that other combinations of producing the leaky BOX and non-leaky BOX areas could be envisioned by those skilled in the art.

The embodiments that follow are suitable for a low dose SIMOX process as described in detail in U.S. Pat. Nos. 5,930,643, 6,043,166, and 6,090,689 (incorporated herein by reference). The main element of the low dose SIMOX process includes a base dose oxygen implant performed at elevated temperatures (300° C.–550° C.), a randomizing implant performed at room temperature (RT implant), and finally a 1320° C., 15 hour annealing process performed in argon. The oxygen implant energy/dose and annealing conditions are typically optimized to meet a specific application of BOX and SOI thickness while also maintaining high quality SOI and BOX material properties and low defect levels across the wafer.

The low dose SIMOX processes used in the following illustrations are optimized for a nominal Si thickness of 1450 angstroms and a nominal BOX thickness of 1350 angstroms, however, the following is applicable to all size substrates. The process conditions described to modify the leakage properties of the BOX can be applied and optimized to work for any particular BOX and silicon thickness application.

In a typical process to produce a low leakage BOX, the following process sequence is used to produce a SOI substrate. First, a bulk silicon substrate is provided. Then, a base dose oxygen implant is performed with, for example, a dosage of 3.3E17, an energy level of 210 KeV, and temperature of 350° C. Next, a room temperature implant occurs with, for example, a dosage of 2E1 5, energy level of 210 KeV, and at room temperature. Then, the substrate undergoes annealing at 1320° C. for 15 hours using an argon ambient with 5–45% oxygen. Finally, the remaining surface of SiO$_2$ is stripped. Referring now to the drawings, there are shown preferred embodiments of the method and structures according to the present invention.

As shown in FIGS. 1A, 1B, 1C and FIG. 2, in the first embodiment of the present invention, one way to produce a body contact is to eliminate the room temperature (RT) implant in areas where a leaky BOX is required. This can be achieved by depositing a hard mask material such as silicon dioxide, followed by photolithographic patterning. FIGS. 1A, 1B, and 1C show the structure of the first embodiment, more specifically a silicon substrate 110 undergoing a first oxygen implant 115 forming an incomplete BOX 120 in the silicon substrate layer 110 followed by a hard mask and room temperature implantation 125. The complete structure is shown with a mask 140 on top of the silicon substrate layer 110 with a plurality of complete (non-leaky) BOX regions 130 shown sandwiching an incomplete (leaky) BOX region 120.

FIG. 2 illustrates the process of first starting 145 with a bulk silicon substrate 110, and then adding 150 a base dose oxygen implant 115 with predetermined parameters (dose 3.3E17, energy 210 KeV, temperature 350° C.). Then, a SiO$_2$ mask 140 is deposited 155 using conventional masking techniques, at a thickness sufficient to block a subsequent room temperature implant from entering the silicon substrate 110. The SiO$_2$ mask thickness is, for example, approximately 10,000 angstroms. Next, the mask undergoes a photopatterning step 160 using conventional lithographic techniques to expose the areas of the substrate where a low leakage BOX is required. After this, the aforementioned room temperature implant 125 is performed 165 with predetermined parameters (dose 2E1 5, energy 210 KeV, room temperature). Upon completion of this step, the hard mask SiO$_2$ 140 is stripped off 170. Then, the substrate undergoes an annealing stage 175 using predetermined parameters (1320° C., 15 hours, argon ambient with 5–45% oxygen).

In this embodiment, by eliminating the room temperature (RT) implant 125 in the defined areas 120, the BOX does not form properly and thus becomes leaky and forms a body contact in areas 120. One characteristic of this technique is that the area 120 without a RT implant can have a much thinner BOX than the other areas, and therefore the leakage can intentionally be made uncontrollably high.

FIGS. 3A, 3B, 3C and FIG. 4 illustrate a second embodiment of the present invention, which is an alternative desirable way to produce a body contact with a controllable BOX leakage by slightly adjusting the RT implant conditions until the desired leakage levels are achieved.

FIGS. 3A, 3B, and 3C show the structure of the second embodiment, more specifically a silicon substrate 210 undergoing a first oxygen implant and a room temperature implant 215 forming a complete BOX 230 in the silicon substrate layer 210 followed by a hard mask 240 and room temperature implantation 225. The complete structure is shown with the mask 240 on top of the silicon substrate layer 210 with a plurality of leaky BOX regions 220 shown sandwiching a complete BOX region 230.

The table below (Table 1) shows the dependence the BOX leakage has when the RT implant energy or dose is varied around the operating conditions typically used to produce a low leakage BOX. Table 1 shows that an increase in energy results in an ever-increasing BOX leakage. Similarly, an increase in RT I/I dose also results in an ever-increasing BOX leakage.

TABLE 1

BOX Leakage as a Function of RT I/I Energy and Dose in Low Dose SIMOX

| Energy, Dose | BOX Leakage* (nA/cm$^2$) |
|---|---|
| 200 KeV, 2E15 | 1.38 |
| 205 KeV, 2E15 | 2.96 |
| 210 KeV, 2E15 | 5.72 |
| 212 KeV, 2E15 | 1982.24 |
| 220 KeV, 2E15 | 4615.38 |
| 230 KeV &> | >118,343 |
| RT I/I Dose E15, 212 KeV | |
| 1.25 | 14.59 |
| 1.5 | 15.38 |
| 1.75 | 106.51 |
| 2 | 1982.24 |
| 2.5 | 104398 |

The BOX leakage measurements are taken on a 0.0507 cm$^2$ dot using a 2MV/cm field, or approximately 27 V.

This effect is used to create body contacts (leaky BOX areas) in specific areas by the sequence described and illustrated in FIG. 4, which shows the process of first starting 245 with a bulk silicon substrate 210, and then adding 250 a base dose oxygen implant 215 with predetermined parameters (dose 3.3E17, energy 210 KeV, temperature 350° C.). Next, a room temperature implant 215 is added 255 with predetermined parameters (dose 2E15, energy 210 KeV, room temperature). Then, a SiO$_2$ mask 240 is deposited 260 using conventional masking techniques, at a thickness sufficient to block a subsequent room temperature implant from entering the silicon substrate. The SiO$_2$ mask thickness is approximately 10,000 angstroms. Next, the substrate undergoes a photopatterning step 265 using conventional lithographic techniques to expose the areas of the substrate where the body contact (leaky BOX) is required. After this, an additional room temperature implant is added 270 with predetermined parameters (dose 0.5–2E15, energy 212 KeV, room temperature). Upon completion of this step, the hard mask 240 SiO$_2$ is stripped off 275. Then, the substrate undergoes an annealing stage 280 using predetermined parameters (1320° C., 15 hours, argon ambient with 5–45% oxygen).

This second alternative sequence produces a body contact through a leaky BOX material only in the areas defined by the photopatterning of the hard mask. Because only slight modifications are made to the RT implant, any morphology problems inherent with the first embodiment are minimized. The amount of BOX oxidation during annealing is the same everywhere in this embodiment since it is exposed to both the base and the RT implant. The third ion implant is then used to create leakage with a minimal effect on topography.

FIGS. 5A, 5B, 5C and FIG. 6 illustrate a third embodiment of the present invention, which is an alternative method used to achieve the desirable results described in embodiment 2, without performing the RT implant twice. Here, a thin hard mask is used such that it only partially blocks the RT implant. The hard mask thickness and RT implant conditions are optimized to achieve the effect shown in Table 1, which once again shows how the BOX leakage increases as the RT implant energy is increased. By increasing the RT implant energy, the position of the oxygen implant profile and resulting damaged layer is moved deeper into the silicon substrate. A thin hard mask can be employed, which only partially blocks the RT implant such that it effectively moves the oxygen dose and damaged layer up in the silicon, similar to reducing the RT implant energy.

FIGS. 5A, 5B, and 5C show the structure of the third embodiment, more specifically a silicon substrate 310 undergoing a first oxygen implant 315 forming an incomplete BOX 320 in the silicon substrate layer 310 followed by a thin hard mask pattern 341, and room temperature implantation 325. The complete structure is shown with a plurality of mask regions 341, on top of the silicon substrate layer 310 with a plurality of complete BOX regions 330 shown sandwiching an incomplete BOX region 320.

The sequence to achieve these results is detailed in FIG. 6, which shows the process of first starting 345 with a bulk silicon substrate 310, and then adding 350 a base dose oxygen implant 315 with predetermined parameters (dose 3.3E 17, energy 210 KeV, temperature 350° C.). Then, a SiO$_2$ hard mask 341 is deposited 355 using conventional masking techniques, at a thickness sufficient to block a subsequent room temperature implant from entering the silicon substrate. The thickness is "tuned" such that the oxygen dose and the damaged layer profile under the hard mask is equivalent to the conditions used to achieve the "good" BOX, while the actual implant energy and dose is set to achieve a "leaky" BOX in the unmasked areas. The SiO$_2$ mask thickness is approximately 100–500 angstroms. For example, if the 200 KeV RT implant energy is used and gives low leakage because its depth is, for example, 1400 angstroms into the silicon, then a mask of, for example, 200 angstroms of oxide would allow the 212 KeV RT implant to give a deeper profile in the unmasked area and lead to more leakage there, however, the implant through the thin oxide mask would make the 212 KeV penetrate to the same 1400 angstroms and thus equal to the original 200 KeV implant depth. This would provide an area of low leakage. If the mask is made too thick, for example, greater than 500 angstroms, then the implant would be too shallow for practical use. Therefore, a useful range for this mask might be 100–500 angstroms.

Next, the mask 341 undergoes a photopatterning step 360 using conventional lithographic techniques to expose the areas of the substrate where the body contact (leaky BOX) is required. After this, a room temperature implant 325 is added with predetermined parameters (dose 2E15, energy 230 KeV, room temperature). Upon completion of this step, the hard mask SiO$_2$ is stripped off 370. Then, the substrate undergoes an annealing stage 385 using predetermined parameters (1320° C., 15 hours, argon ambient with 5–45% oxygen).

This third alternative technique achieves the desired body contact areas by using one photopatterning step and one RT implant. The first embodiment has one area that sees no RT implant and may form a different topography upon annealing. Whereas, the third embodiment allows for the base dose to be implanted everywhere, but at selected regions different depths corresponding to different desired leakage levels.

However, this process may take more time to optimize due to the interrelation between the hard mask thickness and the RT implant conditions needed to achieve good and leaky BOX areas while maintaining good morphology and good Si/BOX material properties.

Those skilled in the art could also use a similar process sequence where the mask polarity is reversed such that the open area produces a good BOX and the partially blocked area produces a body contact (leaky BOX). Again, this would require optimization of the hard mask thickness and RT implant conditions to achieve the desired results. A thinner mask is easier to deposit, implant through, pattern, etch and remove. It also allows for other options, such as lowering the implant energy or raising it depending on the layout or implanter tool capabilities, etc.

FIGS. 7A, 7B, 7C and FIG. 8 illustrate a fourth embodiment of the present invention, which includes using two hard mask steps where each is sufficiently thick enough to fully block the RT implant. This sequence requires more processing steps and requires a zero-level alignment mark so each mask level can be aligned to a reference. The advantage of this process includes independent control of each RT area.

FIGS. 7A, 7B, and 7C show the structure of the fourth embodiment, more specifically a silicon substrate 410 with an incomplete BOX 420 therein. A first mask 440 is patterned and a first room temperature implant 415 is performed. This forms a plurality of complete BOX regions 430 shown sandwiching a leaky BOX region 420. Following the formation of a second mask 441 and another room temperature implant, the complete structure is shown with 425 the complete BOX regions 430, which are shown sandwiching a leaky BOX region 420.

FIG. 8 diagrams the process to achieve these results, which shows the process of first starting 445 with a bulk silicon substrate 410, and then adding 450 a base dose oxygen implant with predetermined parameters (dose 3.3E17, energy 210 KeV, temperature 350° C.) to form the incomplete BOX 420. Then, a $SiO_2$ hard mask 440 is deposited 455 using conventional masking techniques, at a thickness sufficient to block a subsequent room temperature implant from entering the silicon substrate. The $SiO_2$ mask thickness is approximately 10,000 angstroms. Next, the first mask 440 undergoes a photopatterning step 460 using conventional lithographic techniques to expose the areas of the substrate where the body contact (leaky BOX) is required. After this, a first room temperature implant 465 is performed with predetermined parameters (dose 2E15, energy 230 KeV, room temperature). Upon completion of this step, the first hard mask $SiO_2$ is stripped off 470.

Following this step is depositing 475 another $SiO_2$ hard mask 441 using conventional masking techniques, at a thickness sufficient to block a subsequent room temperature implant from entering the silicon substrate. The second $SiO_2$ mask 441 thickness is also approximately 10,000 angstroms. Next, the second mask 441 undergoes a photopatterning step 480 using conventional lithographic techniques to expose the areas of the substrate where the body contact (leaky BOX) is required. The second mask 441 now covers the selected areas that will become completed BOX areas and exposes the incomplete BOX areas. After this, an additional room temperature implant 415 is made 485 with predetermined parameters (dose 2E15, energy 210 KeV, room temperature). The second RT or touch-up implant can be made different from the first implant to add a new property to the film. For example, the first RT implant is half the dose of the usual RT implant and then the second RT implant is the remaining half dose. This allows the areas receiving both implants to have a predictable leakage, while the other areas have yet a third leakage property. Alternatively, the second implant of this embodiment could be a different species or implanted at a different energy level such that it best matches the results predicted in Table 1.

Upon completion of this step, the second hard mask 441 is stripped off 490. Then, the substrate undergoes an annealing step 495 using predetermined parameters (1320° C., 15 hours, argon ambient with 5–45% oxygen).

In this alternative method, the RT implant conditions in each area are individually optimized to achieve the desired results. If the combination of the first base implant and second RT implant lead to a certain topography upon formation, then a second mask is used to align to this difference in thickness or color. Then, a new mask is deposited such that the new feature (e.g. polysilicon gate) is aligned over this leaky BOX region. A final implant is then performed which would convert some of the areas that were not masked by either the first or second implants into a third conductivity type for specific applications.

In the present invention, the patterned areas, which are modified to produce a leaky BOX, show a bright field optical contrast since the BOX and silicon thickness are slightly modified in the range of 10–100 angstroms. This contrast difference then allows the alignment of subsequent device structures to these areas. This "built-in-alignment" scheme is used to align the different device types to the preferred underlying BOX layers. Alternatively, a separate zero level alignment mark may be added if a higher contrast mark is needed later in the processing.

During the formation of a normal BOX layer, the annealing step causes the buried oxide to grow in thickness due to oxygen diffusion from the anneal furnace ambient into the buried oxide causing it to grow. If the process is modified such that the implanted regions receive a different species or dose, then the amount of this growth in the buried oxide film changes. This leads to a different BOX thickness which results in the top surface of the wafer being slightly raised or lowered due to the expansion of the BOX beneath it. This makes the structure unique, depending on the implant process. Therefore, the structure will be discoverable by doing a high resolution SEM or TEM analysis to show the BOX features. Also, X-ray analysis could identify a different species, (e.g., nitrogen) in the buried oxide in only specific regions which would again be discoverable upon analyzing the structure.

The main benefits of this invention are to form a body contact from the backside of the wafer which will reduce body charging and therefore reduce undesirable floating body effects on SOI CMOS devices. Also, this invention can be used to link the body of one device to the body of another device by making the BOX under both devices leaky and therefore connected to the same wafer backside conducting layer. Alternatively, another use of the invention can be to bias the backside of the wafer, and any areas that have a leaky BOX can then be biased as well. This could be used to selectively bias multiple devices using active well switching technology. The reduction in floating body effects can also be applied to DRAM structures, where the SOI devices are usually too leaky and also have too many floating body effects for very sensitive DRAM devices. By draining this charge through the leaky BOX, it might enable a DRAM on SOI technology that is not available today except through frontside body contact schemes.

Another possible use is to be able to provide specific leakage BOX SOI wafers. By tuning the leakage as shown in Table 1, the product could be made with various specifications on the BOX leakage. These different BOX leakage values can be tailored to perhaps different product applications.

While the invention has been described in terms of preferred and alternative embodiments, those skilled in the art will recognize that the invention can be practiced with modifications made within the spirit and scope of the appended claims.

What is claimed is:

1. A method of forming a substrate contact in a silicon on insulator (SOI) structure, comprising the sequential steps of:

depositing a base dose oxygen implant into a silicon substrate to form a buried oxide layer (BOX);

patterning a mask on said silicon substrate, the thickness of said mask blocking implants; in selected regions performing a room temperature implant on said SOI structure, selectively changing the depth of said implant to alter the electrical characteristics of said BOX;

removing said mask from said SOI structure; and annealing said SOI structure.

2. The method of claim 1, wherein said base dose oxygen implant creates a region of reduced conductivity in said substrate compared with regions of said substrate not receiving said base dose oxygen implant.

3. The method of claim 2, wherein said room temperature implant creates a non-conducting region in said substrate, wherein said non-conducting region has a lower conductivity than said reduced conducting region.

4. The method of claim 3, wherein said mask creates a border over said reduced conducting region.

5. The method of claim 3, wherein said mask creates a border over said non-conducting region.

6. The method of claim 1, wherein said mask blocks said room temperature implant from entering corresponding areas of said substrate.

7. The method of claim 1, wherein said mask partially blocks said room temperature implant from entering corresponding areas of said substrate.

8. The method of claim 1, wherein said patterning exposes said substrate where said substrate contact will reside.

9. A method of forming a substrate contact in a silicon on insulator (SOI) structure, comprising the sequential steps of:

depositing a base dose oxygen implant into a silicon substrate to form a buried oxide layer (BOX);

patterning a mask on said silicon substrate, the thickness of said mask blocking implants; in selected regions performing a room temperature implant on said SOI structure, selectively changing the depth of said implant to alter the electrical characteristics of said BOX;

removing said mask from said SOI structure; and annealing said SOI structure, wherein said base dose oxygen implant creates a region of reduced conductivity in said silicon substrate compared with regions of said silicon substrate not receiving said base dose oxygen implant, wherein said room temperature implant creates a non-conducting region in said silicon substrate, wherein said non-conducting region has a lower conductivity than said reduced conducting region, and wherein said patterning exposes said silicon substrate where said silicon substrate contact will reside.

10. The method of claim 9, wherein said mask creates a border over said reduced conducting region.

11. The method of claim 9, wherein said mask creates a border over said non-conducting region.

12. The method of claim 9, wherein said mask blocks said room temperature implant from entering corresponding areas of said substrate.

13. The method of claim 9, wherein said mask partially blocks said room temperature implant from entering corresponding areas of said substrate.

* * * * *